United States Patent [19]
Cherukuri

[11] Patent Number: 6,006,307
[45] Date of Patent: Dec. 21, 1999

[54] COMPUTER SYSTEM EMPLOYING A MIRRORED MEMORY SYSTEM FOR PROVIDING PREFETCH BANDWIDTH

[75] Inventor: Ravikrishna Cherukuri, Milpitas, Calif.

[73] Assignee: Advanced Micro Devices, Inc., Sunnyvale, Calif.

[21] Appl. No.: 08/970,042

[22] Filed: Nov. 13, 1997

[51] Int. Cl.$^6$ ............................. G06F 12/16; G06F 13/16
[52] U.S. Cl. ........................ 711/114; 711/137; 711/162; 711/168
[58] Field of Search .................... 711/114, 137, 711/162, 168

[56] References Cited

U.S. PATENT DOCUMENTS 5,495,570  2/1996  Heugel et al. ............................ 714/11

OTHER PUBLICATIONS

Bates, Kenneth and Marvin TeGrotenhuis, "Shadowing Boost System Reliability", Computer Design, Apr. 1985, pp. 129 (6).
Park, Hyang Jae and Heonshik Shin, "Real–Time Disk Scheduling Techniques for Mirrored Disk Systems", TENCON '94. IEEE Region 10's Ninth Annual International Conference. Aug. 1994, pp. 474–480.
Patterson et al., *Computer Architecture A Quantitative Approach,* Morgan Kaufmann Publishers, Inc., 1990, pp. 520–521.

*Primary Examiner*—Reginald G. Bragdon
*Attorney, Agent, or Firm*—Conley, Rose & Tayon; Lawrence J. Merkel; B. Noel Kivlin

[57] ABSTRACT

A computer system includes a mirrored memory system, in which each bank is coupled to a different channel from the one or more microprocessors included in the computer system. Each microprocessor is coupled to a fetch channel for performing fetch operations from one of the mirrored memory banks within the computer system. Additionally, each microprocessor is coupled to a prefetch channel for performing prefetch operations from a different one of the mirrored memory banks. In multiprocessor configurations, the microprocessors may share the fetch channel and/or the prefetch channel, or may be provided with separate channels for either fetch or prefetch operations. Prefetch operations do not interfere with fetch operations from the same microprocessor. Additionally, prefetch operations are not preempted by fetch operations (except for write operations which update all memory banks, if the memory banks do not include write queues). Still further, fetch operations from one microprocessor in a multiprocessor configuration do not interfere with prefetch operations from another microprocessor.

16 Claims, 5 Drawing Sheets

COMPUTER SYSTEM EMPLOYING A MIRRORED MEMORY SYSTEM FOR PROVIDING PREFETCH BANDWIDTH

BACKGROUND OF THE INVENTION

1. Field of the Invention

This invention is related to computer systems and, more particularly, to prefetch mechanisms within computer systems.

2. Description of the Related Art

Modern microprocessors are demanding increasing memory bandwidth to support the increased performance achievable by the microprocessors. Increasing clock frequencies (i.e. shortening clock cycles) employed by the microprocessors allow for more data and instructions to be processed per second, thereby increasing bandwidth requirements. Furthermore, modern microprocessor microarchitectures are improving the efficiency at which the microprocessor can process data and instructions. Bandwidth requirements are increased even further due to the improved processing efficiency.

Computer systems typically have a relatively large, relatively slow main memory. Typically, multiple dynamic random access memory (DRAM) modules comprise the main memory system. The large main memory provides storage for a large number of instructions and/or a large amount of data for use by the microprocessor, providing faster access to the instructions and/or data then may be achieved from a disk storage, for example. However, the access times of modern DRAMs are significantly longer than the clock cycle length of modern microprocessors. The memory access time for each set of bytes being transferred to the microprocessor is therefore long. Accordingly, the main memory system is not a high bandwidth system. Microprocessor performance may suffer due to a lack of available memory bandwidth.

In order to increase performance, microprocessors may employ prefetching to "guess" which data will be requested by the program being executed by the microprocessor in the future. If the guess is correct, the delay of fetching the data from memory has already occurred when the data is requested (i.e. the requested data may be available within the microprocessor). The microprocessor may employ a cache, for example, and the data may be prefetched from memory into the cache. The term prefetch, as used herein, refers to transferring data into a microprocessor prior to a request for the data being generated via execution of an instruction within the microprocessor. Generally, prefetch algorithms are based upon the pattern of accesses which have been performed in response to the program being executed.

Unfortunately, prefetch operations compete for bandwidth with fetch operations (i.e. operations performed directly in response to instructions currently being executed by the microprocessor). Since bandwidth to the memory system is already taxed by the fetch operation traffic, prefetch operations may worsen the problem. Still further, in multiprocessor systems, bandwidth occupied by prefetch operations performed by one microprocessor may interfere with fetch operations from another microprocessor.

SUMMARY OF THE INVENTION

The problems outlined above are in large part solved by a computer system in accordance with the present invention. The computer system includes a mirrored memory system, in which each bank is coupled to a different channel from the one or more microprocessors included in the computer system. Each microprocessor is coupled to a fetch channel for performing fetch operations from one of the mirrored memory banks within the computer system. Additionally, each microprocessor is coupled to a prefetch channel for performing prefetch operations from a different one of the mirrored memory banks. In multiprocessor configurations, the microprocessors may share the fetch channel and/or the prefetch channel, or may be provided with separate channels for either fetch or prefetch operations. Advantageously, fetch and prefetch operations are separately allocated bandwidth via the separate fetch and prefetch channels. Prefetch operations do not interfere with fetch operations from the same microprocessor. Additionally, prefetch operations are not preempted by fetch operations (except for write operations which update all memory banks, if the memory banks do not include write queues). Still further, fetch operations from one microprocessor in a multiprocessor configuration do not interfere with prefetch operations from another microprocessor.

Broadly speaking, the present invention contemplates a computer system comprising a memory system and a microprocessor coupled thereto. The memory system includes a first bank and a second bank, wherein each datum stored in the first bank is also stored in the second bank. The microprocessor is configured to independently access the first bank and the second bank.

The present invention further contemplates a method for prefetching in a computer system. Fetch data is read in response to executing an instruction in a microprocessor. The fetch data is read from a first bank of memory. Prefetch data is read in response to a prefetch algorithm employed by the microprocessor. The prefetch data is read from a second bank of memory, wherein each datum stored in the first bank of memory is also stored in the second bank of memory.

Moreover, the present invention contemplates a memory system comprising a first bank and a second bank. The first bank is coupled to a first input channel. Similarly, the second bank is coupled to a second input channel. Each datum stored within the first memory bank is mirrored in the second memory bank.

BRIEF DESCRIPTION OF THE DRAWINGS

Other objects and advantages of the invention will become apparent upon reading the following detailed description and upon reference to the accompanying drawings in which.

Figure 1:
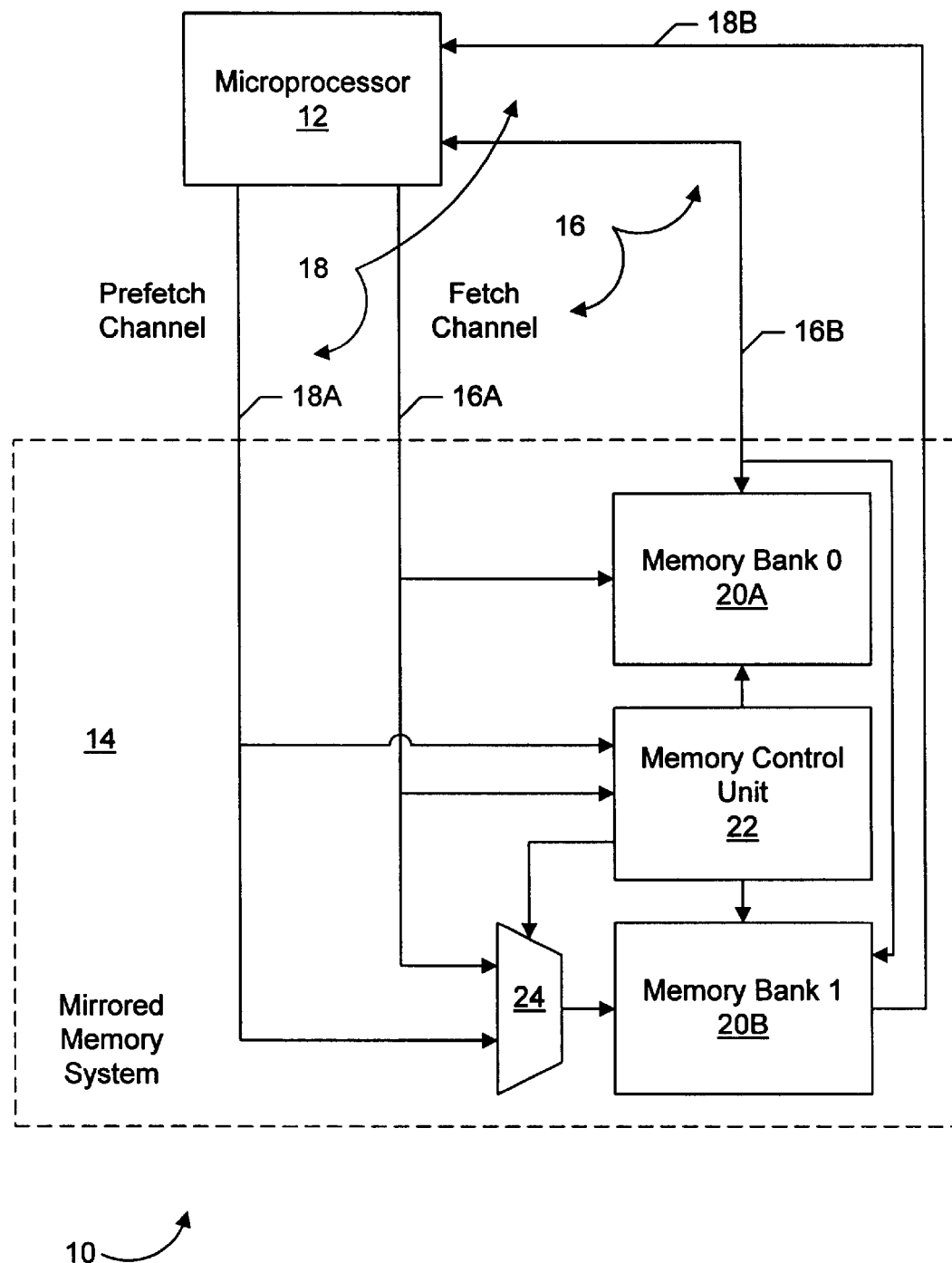
FIG. 1 is a block diagram of one embodiment of a computer system having a mirrored memory system, a prefetch channel, and a fetch channel.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of one embodiment of a computer system 10 is shown. Computer system 10 includes a microprocessor 12 and a mirrored memory system 14. Coupled between microprocessor 12 and memory system 14 is a fetch channel 16 comprising an address portion 16A and a data portion 16B. Additionally, a prefetch channel 18 is coupled between microprocessor 12 and memory 14. Prefetch channel 18 comprises an address portion 18A and a data portion 18B. Memory system 14 comprises a first memory bank 20A and a second memory bank 20B, as well as a memory control unit 22. First memory bank 20A is coupled to fetch channel 16. Memory control unit 22 is coupled to both address portions 16A and 18A, and is further coupled to memory banks 20A and 20B and a multiplexor 24. Multiplexor 24 is further coupled to address portions 16A and 18A and to second memory bank 20B. Second memory bank 20B is further coupled to data portions 16B and 18B.

Generally speaking, computer system 10 provides increased memory bandwidth by "mirroring" first memory bank 20A using second memory bank 20B. Each datum stored in memory bank 20A is also stored in memory bank 20B. In order to read a datum from a particular address, either first memory bank 20A or second memory bank 20B may be accessed. First memory bank 20A and second memory bank 20B are independently and concurrently accessible using fetch channel 16 (for first memory bank 20A) and prefetch channel 18 (for second memory bank 20B). Computer system 10 offers double the bandwidth of a similar computer system employing non-mirrored memory and a single channel thereto.

Microprocessor 12 uses fetch channel 16 for performing fetch operations (i.e. non-speculative memory operations in response to instructions being executed by microprocessor 12). On the other hand, microprocessor 12 uses prefetch channel 18 for performing prefetch operations in response to a prefetch algorithm employed by microprocessor 12. Advantageously, bandwidth consumed by prefetch operations is independent of bandwidth consumed by fetch operations. Fetch operations are not delayed due to a previously initiated prefetch operation, thereby allowing rapid access to data which is currently being operated upon by the program being executed. Additionally, prefetch operations may be performed regularly since dedicated bandwidth is available via prefetch channel 18 (i.e. fetch operations do not preempt prefetch operations).

Microprocessor 12 may employ any suitable prefetch algorithm. Exemplary prefetch algorithms may include a sequential algorithm in which prefetch addresses are generated as sequential to fetch addresses presented via fetch channel 16, a stride based algorithm in which the difference between two fetch addresses is added to the second fetch address to generate a prefetch address, or an algorithm which monitors access patterns and generates prefetch addresses based upon the observed patterns.

Fetch channel 16 and prefetch channel 18 convey memory operations. Generally speaking, a memory operation is a transfer of data between microprocessor 12 and memory system 14. A read operation, or read memory operation, is a memory operation involving a transfer of data from memory system 14 to microprocessor 12. On the other hand, a write operation (or write memory operation) is a memory operation involving a transfer of data from microprocessor 12 to memory system 14. Microprocessor 12 may perform both read and write operations upon fetch channel 16 in response to instructions. According to one embodiment, microprocessor 12 performs only read operations upon prefetch channel 18.

As used herein a "channel" is a communications medium for performing memory operations. For example, a bus may be used to form a channel. As shown in FIG. 1, fetch channel 16 and prefetch channel 18 employ separate lines for conveying the address portion of a memory operation and the data portion of the memory operation. However, channels which convey data and address upon the same lines are contemplated as well. In addition to conveying the address to memory system 14 and data to/from memory system 14, various control signals are conveyed. Control signals may be conveyed during the address portion of a memory operation to indicate the type (read or write) as well as the size of the transfer. Additional control signals may be provided as well. Control signals conveyed during the data portion of a memory operation may include signals which indicate when the data is valid and signals for indicating error conditions.

As mentioned above, memory system 14 is a mirrored memory system . . . each datum stored in first memory bank 20A is stored in memory bank 20B. Generally, a memory bank is a block of memory which responds to addresses presented thereto. The memory bank may comprise one or more random access memories (RAMs) which may store the data in any suitable fashion. For example, a datum may be divided between several of the RAMs, or may be stored in a single RAM. Addresses are provided to a memory bank, and the corresponding data is provided from the bank. According to one embodiment, memory banks 20A and 20B each comprise one or more DRAMs. Alternatively, memory banks 20A and 20B may comprise any other type of memory. According one particular embodiment, memory banks 20A and 20B are compatible with the RAMBUS standard provided by RAMBUS, Inc. RAMBUS memory banks may be suitable because the provide a narrow, high speed data channel. Therefore, the number of pins employed by microprocessor 12 to support fetch channel 16 and prefetch channel 18 may be minimized.

Memory control unit 22 is coupled to both memory banks 20A and 20B to provide control signals thereto. For example, memory control unit 22 is configured to determine if a read or write operation is being performed in order to direct the memory banks to provide data or receive data upon the respective data portion 16B or 18B. Additionally, in order to maintain memory banks 20A and 20B as mirrored memory banks, memory control unit 22 detects when a write operation is conveyed upon fetch channel 16. When a write is detected, memory control unit 22 selects fetch channel 16 to access second memory bank 20B via multiplexor 24. Fetch channel 16 is connected to first memory bank 20A as well, so write operations are presented to both first memory bank 20A and second memory bank 20B concurrently. Memory control unit 22 directs memory banks 20A and 20B to received data from data portion 16B of fetch channel 16. Memory banks 20A and 20B are concurrently updated, thereby maintaining mirrored data in both memory banks.

If a write operation is not being conveyed upon fetch channel 16, then memory control unit 22 selects prefetch channel 18 via multiplexor 24. Independent read operations may thereby be performed concurrently to first memory bank 20A and second memory bank 20B.

Additional control which may be provided by memory control unit 22 in various embodiments may include interleave control if data is read from or written to more than one RAM within a bank in response to a memory operation. Furthermore, RAM control signals may be generated by memory control unit 22. If, for example, memory banks 20A and 20B comprise DRAMs, row and column strobe signals and address selection controls may be provided by memory control unit 22.

It is noted that, in one embodiment, microprocessor 12 may perform fetch operations using prefetch channel 18 if no prefetch operations are pending or if the number of fetch operations awaiting memory access exceeds a predetermined threshold amount. Such an embodiment may employ a second multiplexor between first memory bank 20A and fetch channel 16, to which prefetch channel 18 is also connected. Memory control unit 22 may thereby route a write operation from either channel to both memory banks 20A and 20B. Alternatively, microprocessor 12 may limit fetch operations performed via prefetch channel 18 to read operations.

It is noted that, according to one embodiment, memory control unit 22 may be integrated onto a semiconductor substrate with an L2 cache controller and an expansion bus bridge to an expansion bus such as the Peripheral Component Interconnect (PCI) bus. It is further noted than an L2 cache may be connected between microprocessor 12 and memory 14, if desired.

Figure 2:
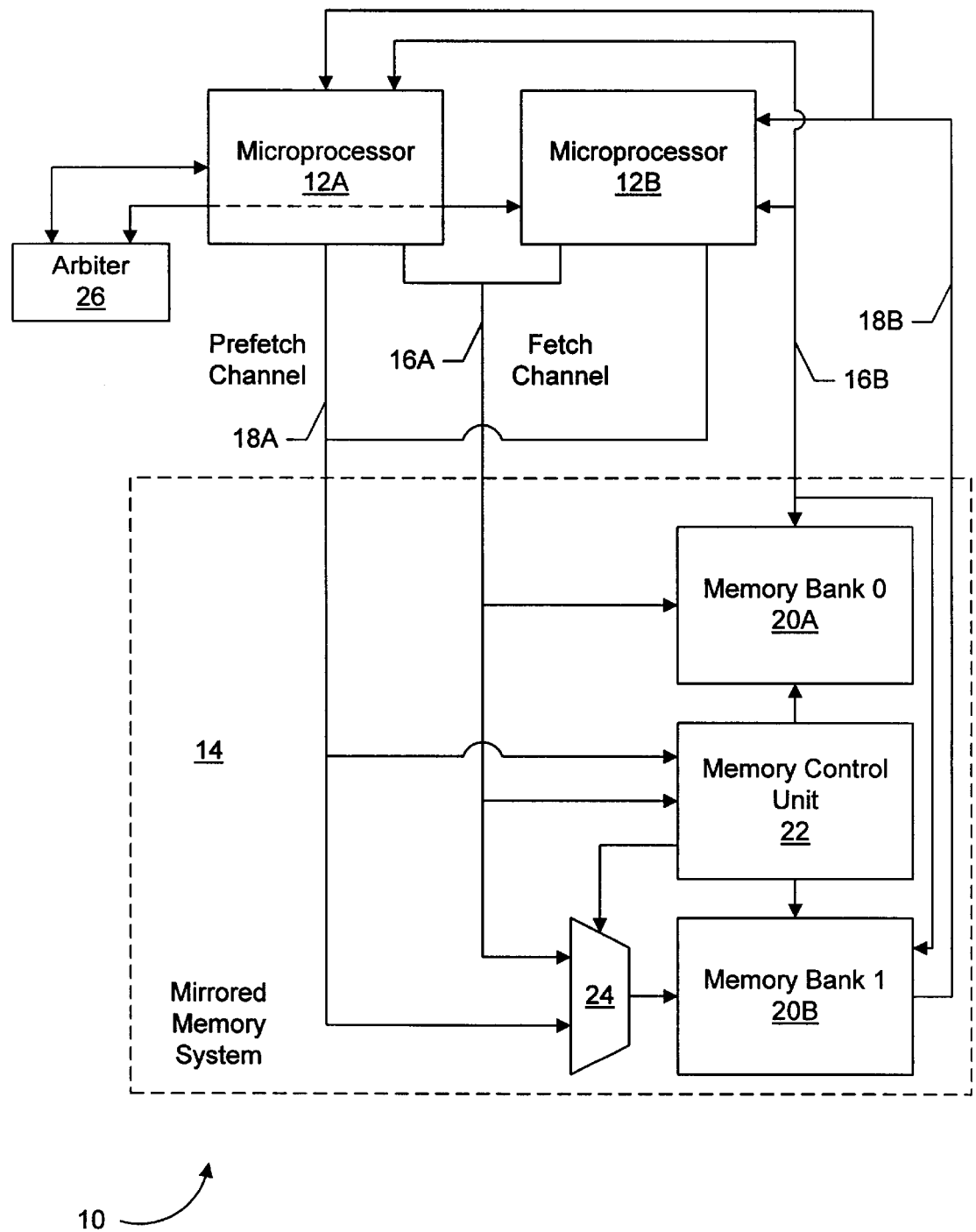
FIG. 2 is a block diagram of one embodiment of a multiprocessor computer system employing a mirrored memory system, a prefetch channel shared by the microprocessors, and a fetch channel shared by the microprocessors.

Turning now to FIG. 2, a block diagram of a second embodiment of computer system 10 is shown. As illustrated in FIG. 2, computer system 10 is a multiprocessor computer system comprising microprocessors 12A and 12B. Additionally microprocessors may be included according to various embodiments. Both microprocessors 12A and 12B are coupled to fetch channel 16 and prefetch channel 18. In the embodiment of FIG. 2, microprocessors 12A and 12B share both fetch channel 16 and prefetch channel 18. Microprocessors 12A and 12B arbitrate for access to fetch channel 16 and prefetch channel 18 via arbiter 26, to which both microprocessors 12A and 12B are coupled.

Upon determining that it is to perform a fetch from memory system 14, microprocessor 12A signals arbiter 26 with a request to use fetch channel 16. Microprocessor 12B similarly signals arbiter 26 when microprocessor 12B determines that it is to perform a fetch from memory system 14. Arbiter 26 selects one of microprocessors 12A or 12B to use fetch channel 16 to perform the corresponding memory fetch. If microprocessor 12B is not signalling for use of fetch channel 16 and microprocessor 12A is signalling, microprocessor 12A is selected to use the bus (and vice versa). If both microprocessors 12A and 12B are signalling for fetch channel 16, then a predetermined scheme is used to select which microprocessor is allowed to use fetch channel 16 (e.g. a fixed-priority scheme or a round-robin scheme).

Similarly, microprocessors 12A and 12B signal arbiter 26 when that microprocessor determines that a prefetch operation is desired. In a fashion similar to granting access to fetch channel 16, arbiter 26 grants access to prefetch channel 18. Advantageously, prefetch operations from one microprocessor 12A or 12B do not consume memory bandwidth at the expense of fetch operations from another microprocessor 12A or 12B.

Figure 3:
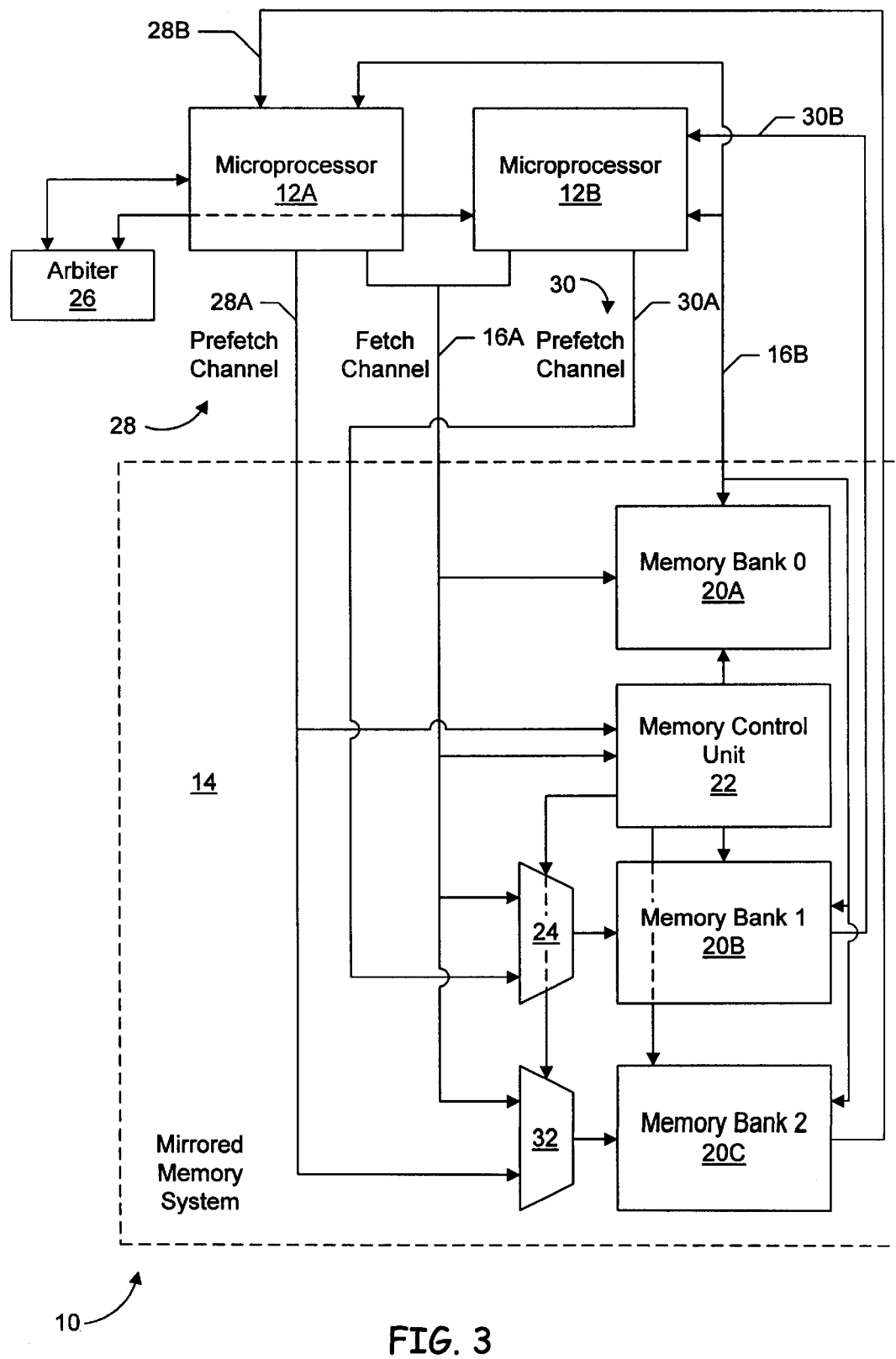
FIG. 3 is a block diagram of another embodiment of a multiprocessor computer system employing a mirrored memory system, a prefetch channel for each microprocessor, and a fetch channel shared by the microprocessors.

FIG. 3 illustrates a third embodiment of computer system 10. As shown in FIG. 3, computer system 10 employs a shared fetch channel 16 coupled to both microprocessors 12A and 12B (with access thereto controlled by arbiter 26, as described above). On the other hand, each microprocessor 12A and 12B is coupled to a separate prefetch channel. Microprocessor 12A is coupled to prefetch channel 28 (including address portion 28A and data portion 28B), and microprocessor 12B is coupled to prefetch channel 30 (including address portion 30A and data portion 30B). Address portion 28A is coupled to a multiplexor 32 to which address portion 16A is also coupled. Multiplexor 32 is coupled to a third memory bank 20C, which is further coupled to data portion 28B and to data portion 16B. Multiplexor 32 is controlled by memory control unit 22 in a fashion similar to multiplexor 24 (which is coupled to receive address portions 30A and 16A in FIG. 3).

Third memory bank 20C stores each datum stored in first memory bank 20A (i.e. third memory bank 20C is a mirror of first memory bank 20A, as is second memory bank 20B). Therefore, each of memory banks 20A, 20B, and 20C may be independently and concurrently accessed for read operations. In the configuration shown in FIG. 3, two prefetch read operations (one from each microprocessor 12A and 12B) and one fetch read operation (from either microprocessor 12A or 12B) may be performed concurrently. If a write operation is performed via fetch channel 16, memory control unit 22 selects address portion 16A through both multiplexors 24 and 32 and directs each memory bank to store the data provided upon data portion 16B. In this manner, the mirroring within each memory bank 20A–20C is maintained.

In addition to providing separate prefetch channels, embodiments of computer system 10 may be configured to provide separate fetch channels for each microprocessor as well. Alternatively, embodiments of computer system 10 are contemplated in which a shared prefetch channel is included and each microprocessor 12A–12B is provided with a separate fetch channel. It is noted that memory system 14 may provide as many mirrored memory banks as desired to provide for prefetching and fetching bandwidth requirements, as well as for any other desired uses. Additionally, each microprocessor 12A–12B may be coupled to as many mirrored memory banks as desired. It is further noted that memory control unit 22 may be inserted between address portions of the fetch and prefetch channels illustrated above, in order to allow for addresses to be conveyed to memory system 14 and the corresponding data conveyed upon the corresponding channel when the address is presented to the corresponding memory bank. FIGS. 1–3 have been illustrated with the channels directly connected for clarity.

Figure 4:
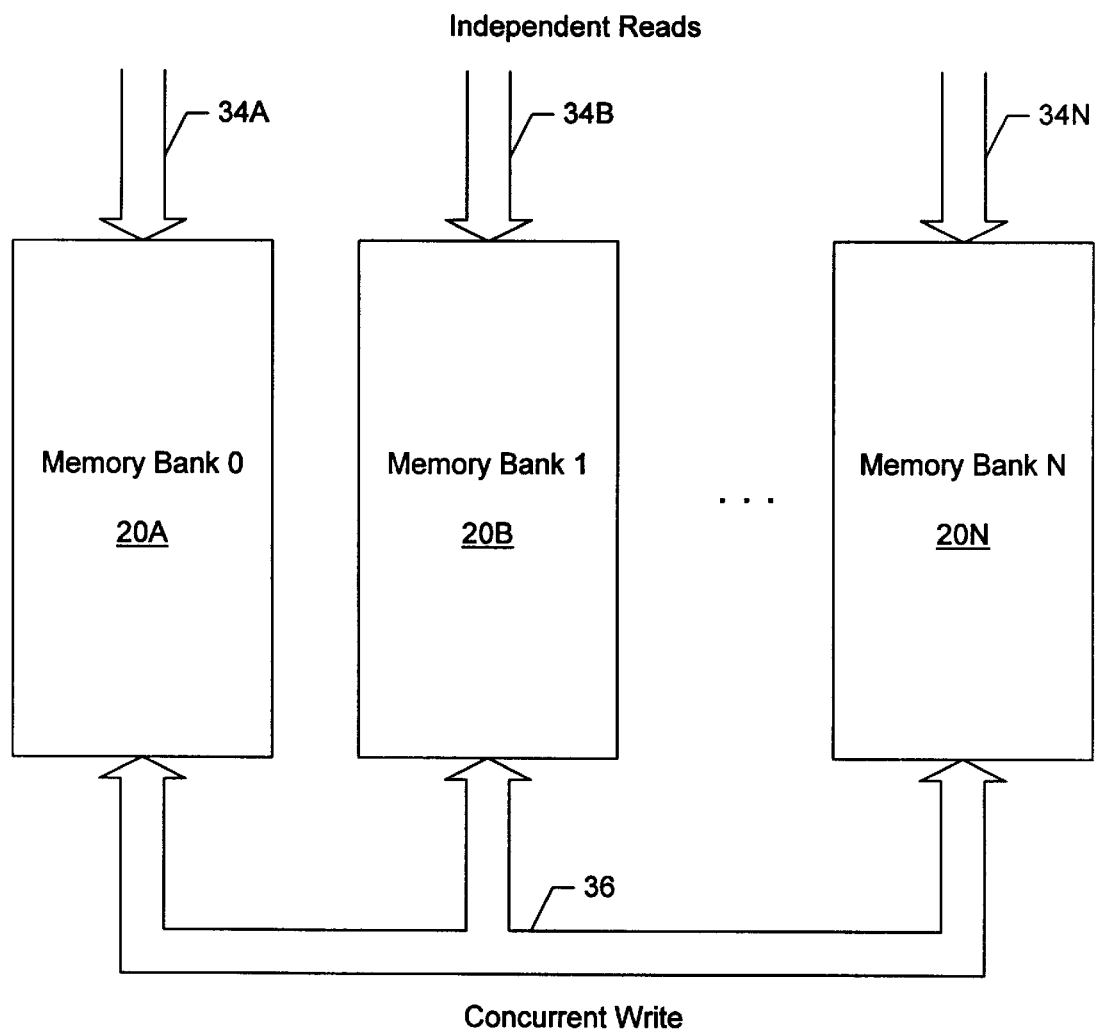
FIG. 4 is a block diagram illustrating read and write operations to one embodiment of a mirrored memory system.

Turning now to FIG. 4, a block diagram is shown illustrating reading and writing mirrored memory system 14 at a conceptual level. Mirrored memory system 14 includes a plurality of memory banks 20A–20N. Up to one concurrent and independent read operation per memory bank 20A–20N may be conveyed, as illustrated by arrows 34A–34N in FIG. 4. Other embodiments may provide for multiple concurrent read accesses from a particular bank 20A–20N. Alternatively, one coherent write operation may be performed to all memory banks 20A–20N.

Figure 5:
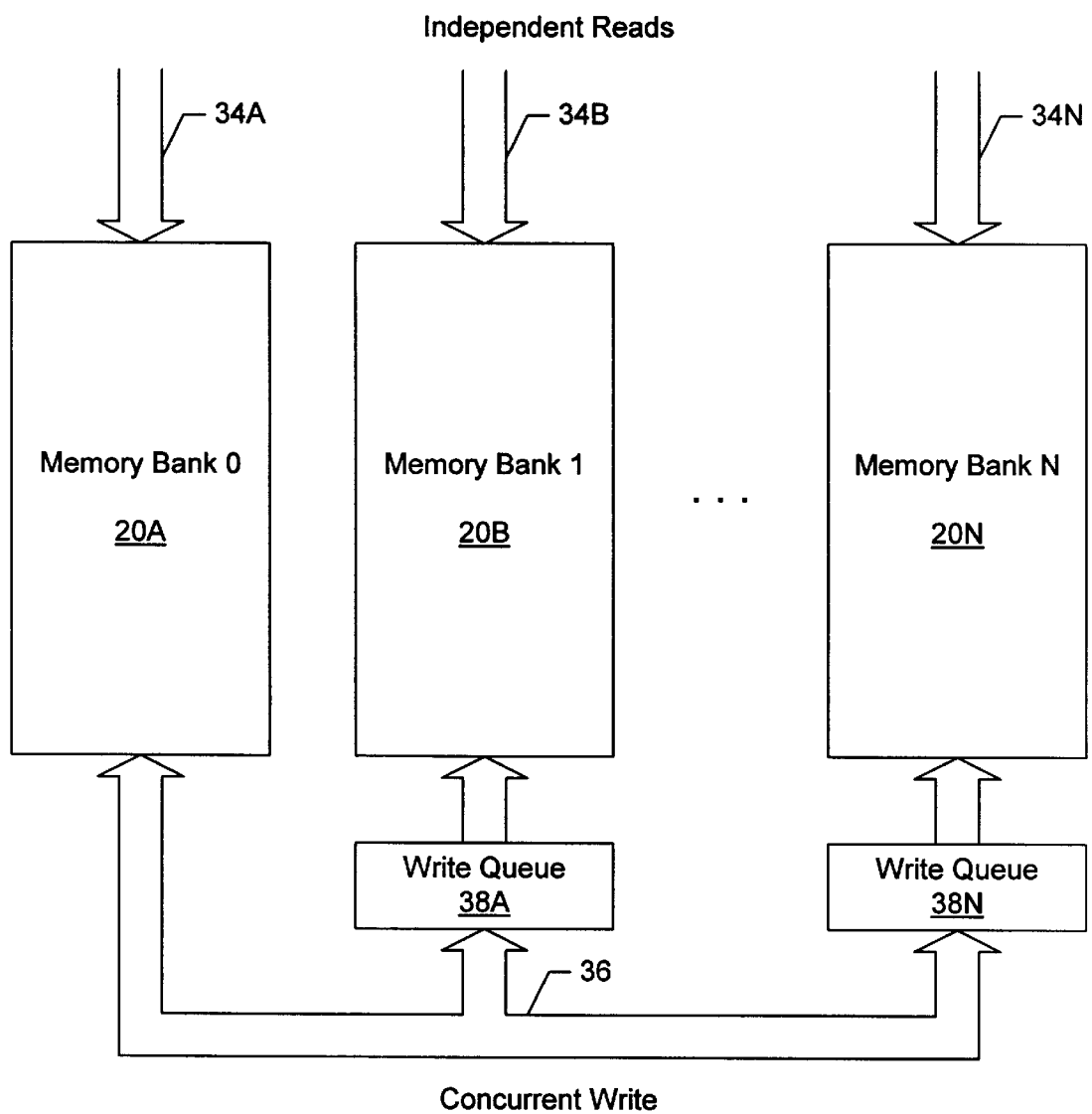
FIG. 5 is a block diagram illustrating read and write operations to a second embodiment of a mirrored memory system.

FIG. 5 illustrates an alternative embodiment in which write operations are queued to the mirrored memory banks 20B–20N used for prefetch channels. For example, write queues 38A–38N may be employed for storing write operations. By employing write queues 38A–38N, prefetch operations which are initiated upon a prefetch channel concurrent with a write operation upon fetch channel 16 may be allowed to continue, and the write operation may be performed to the corresponding memory bank 20B–20N after the prefetch operation is completed. Since memory bank 20A is coupled to fetch channel 16, a write queue may be omitted for memory bank 20A. Prefetch operations are compared to the write operations stored in the write queue 38A–38N coupled to the memory bank 20B–20N to which the prefetch operation is being performed in order to detect a prefetch operation which reads data updated by one of the queued write operations. If such a prefetch operation is detected, the prefetch operation is delayed to allow the write operations to be stored into the corresponding memory bank 20B–20N.

In accordance with the above disclosure, a computer system has been provided which uses a mirrored memory system to increase the memory bandwidth available to one or more microprocessors included therein. The microprocessors access one memory bank with fetch operations using a fetch channel, and independently access a second memory bank with prefetch operations using a prefetch channel. Since the banks are mirrored, the correct data is read using either channel. Advantageously, prefetch bandwidth is available without occupying fetch bandwidth. Performance may be increased by the higher available bandwidth.

Numerous variations and modifications will become apparent to those skilled in the art once the above disclosure is fully appreciated. It is intended that the following claims be interpreted to embrace all such variations and modifications.

What is claimed is:

1. A computer system comprising:
a memory system including a first bank and a second bank wherein each datum stored in said first bank is also stored in said second bank; and
a microprocessor coupled to said memory system, wherein said microprocessor is configured to independently access said first bank and said second bank, and wherein said microprocessor is configured to read fetch data in response to executing an instruction from said first bank of memory, and wherein said microprocessor is configured to concurrently read prefetch data in response to a prefetch algorithm employed by said microprocessor from said second bank of memory.

2. The computer system as recited in claim 1 wherein said microprocessor is configured to perform a write operation concurrently to both said first bank and said second bank.

3. The computer system as recited in claim 2 wherein said memory system is configured to update a first datum stored in both said first bank and said second bank in response to said write operation.

4. The computer system as recited in claim 2 wherein said second bank includes a buffer, and wherein said buffer is configured to receive a first datum updated by said write operation if a third read operation is performed by said microprocessor to said second bank concurrent with said write operation.

5. The computer system as recited in claim 1 further comprising a first channel coupled between said first bank and said microprocessor and a second channel coupled between said second bank and said microprocessor.

6. The computer system as recited in claim 5 wherein said first channel is a fetch channel, and wherein said microprocessor is configured to perform a first memory operation upon said fetch channel in response to an instruction being executed within said microprocessor.

7. The computer system as recited in claim 6 wherein said second channel is a prefetch channel, and wherein said microprocessor is configured to perform a second memory operation upon said prefetch channel in response to a prefetch algorithm employed by said microprocessor.

8. The computer system as recited in claim 7 wherein said memory system further includes a memory control unit coupled to said first channel, said second channel, said first bank, and said second bank, and wherein said memory control unit is configured to control said first bank in response to said first memory operation and said second bank in response to said second memory operation.

9. The computer system as recited in claim 8 wherein said memory system further includes a selection device coupled between said second channel and said second bank, wherein said selection device receives a selection control from said memory control unit.

10. The computer system as recited in claim 9 wherein said first channel is coupled to said selection device.

11. The computer system as recited in claim 10 wherein said memory control unit is configured to detect a write operation upon said first channel and to select said first channel using said selection device in response thereto, whereby both said first bank and said second bank are updated in response to said write operation.

12. The computer system as recited in claim 11 wherein said memory control unit is configured to detect an absence of said write memory operation upon said first channel and to select said second channel using said selection device in response thereto.

13. A method for prefetching in a computer system, comprising:
reading fetch data in response to executing an instruction in a microprocessor from a first bank of memory;
reading prefetch data in response to a prefetch algorithm employed by said microprocessor from a second bank of memory, wherein each datum stored in said first bank of memory is also stored in said second bank of memory; and
wherein said reading fetch data and said reading prefetch data are performed concurrently.

14. The method as recited in claim 13 further comprising writing a first datum to said first bank of memory.

15. The method as recited in claim 14 further comprising writing said first datum to said second bank of memory.

16. The method as recited in claim 15 wherein said writing a first datum to said first bank of memory and said writing said first datum to said second bank of memory are performed concurrently.

* * * * *